(12) United States Patent
Lin et al.

(10) Patent No.: US 11,798,907 B2
(45) Date of Patent: Oct. 24, 2023

(54) SEMICONDUCTOR PACKAGES

(71) Applicant: Advanced Semiconductor Engineering, Inc., Kaohsiung (TW)

(72) Inventors: Yung-Sheng Lin, Kaohsiung (TW); Yun-Ching Hung, Kaohsiung (TW); An-Hsuan Hsu, Kaohsiung (TW); Chung-Hung Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 224 days.

(21) Appl. No.: 17/092,195

(22) Filed: Nov. 6, 2020

(65) Prior Publication Data

US 2022/0148989 A1    May 12, 2022

(51) Int. Cl.
*H01L 23/00*    (2006.01)

(52) U.S. Cl.
CPC .............. *H01L 24/13* (2013.01); *H01L 24/16* (2013.01); *H01L 24/81* (2013.01); *H01L 2224/10145* (2013.01); *H01L 2224/1357* (2013.01); *H01L 2224/13541* (2013.01); *H01L 2224/16148* (2013.01); *H01L 2224/16238* (2013.01); *H01L 2224/8102* (2013.01); *H01L 2224/81007* (2013.01); *H01L 2224/81193* (2013.01); *H01L 2224/81232* (2013.01)

(58) Field of Classification Search
None
See application file for complete search history.

(56) References Cited

U.S. PATENT DOCUMENTS

| 10,483,230 B2 | 11/2019 | Lim et al. |
| 2021/0183811 A1* | 6/2021 | Lee ...................... H01L 21/4853 |

OTHER PUBLICATIONS

Yang, Sean et al. "Development of Low-temperature, Presssureless Copper-to-Copper Bonding by Microfluidic Electroless Interconnection Process", 2018 IEEE 68th Electronic Components and Technology Conference, Jun. 2018. 6 pages.

* cited by examiner

*Primary Examiner* — Hung K Vu
(74) *Attorney, Agent, or Firm* — FOLEY & LARDNER LLP

(57) ABSTRACT

A semiconductor package includes a first substrate, a first flow channel and a second flow channel. The first flow channel is on the first substrate. The second flow channel is on the first substrate and in fluid communication with the first flow channel. The second flow channel is spaced from an inlet and an outlet of the first flow channel. The first flow channel and the second flow channel constitute a bonding region of the first substrate.

4 Claims, 18 Drawing Sheets

SEMICONDUCTOR PACKAGES

BACKGROUND

1. Field of the Disclosure

The present disclosure relates to semiconductor packages and particularly to semiconductor packages including supporting structures.

2. Description of Related Art

The electroless plating process has been used in the bonding of die to die or die to wafer. Electroless plating layers are formed to bond conductive pillars or bumps of a top substrate to conductive pillars or bumps of a bottom substrate. To have a better reliability, it is desirable to make the electroless plating layers have similar thickness.

SUMMARY

According to some embodiments of the present disclosure, a semiconductor package includes a first substrate, a first flow channel and a second flow channel. The first flow channel is on the first substrate. The second flow channel is on the first substrate and in fluid communication with the first flow channel. The second flow channel is spaced from an inlet and an outlet of the first flow channel. The first flow channel and the second flow channel constitute a bonding region of the first substrate.

According to some embodiments of the present disclosure, a semiconductor package includes a substrate, a plurality of bonding elements and a plurality of supporting structures. The substrate has a first side and a second side adjacent to the first side. The plurality of bonding elements are on the substrate. The plurality of supporting structures are disposed on the substrate and separated from each other. The plurality of supporting structures define a first opening at the first side and a second opening at the second side.

According to some embodiments of the present disclosure, a semiconductor package includes a substrate, a plurality of bonding elements and a plurality of supporting structures. The plurality of bonding elements are on the substrate. The plurality of supporting structures are disposed on corners of the substrate. An imaginary area defined by geometric centers of the plurality of supporting structures encloses a portion of the plurality of bonding elements.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
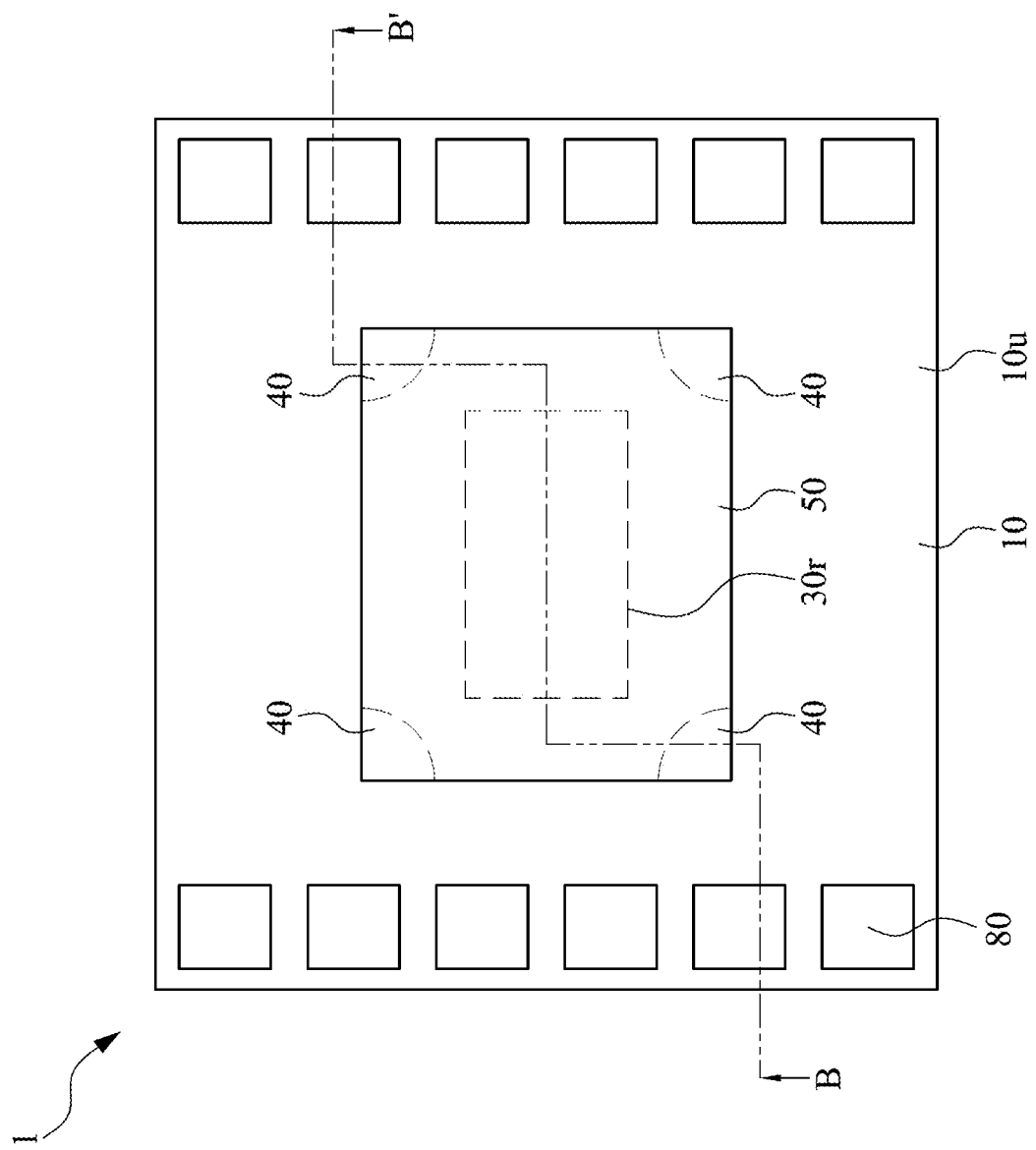
FIG. 1A is a top view of a semiconductor package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor package with supporting structures. The supporting structures define more than one flow channels and additional inlet(s)/outlet(s) for a plating solution. With the design and arrangement of the supporting structure, a relatively uniform flow field of the plating solution can be created and the resulting electroless plating layers have uniform thickness as compared to the conventional plating structure.

Figure 1B:
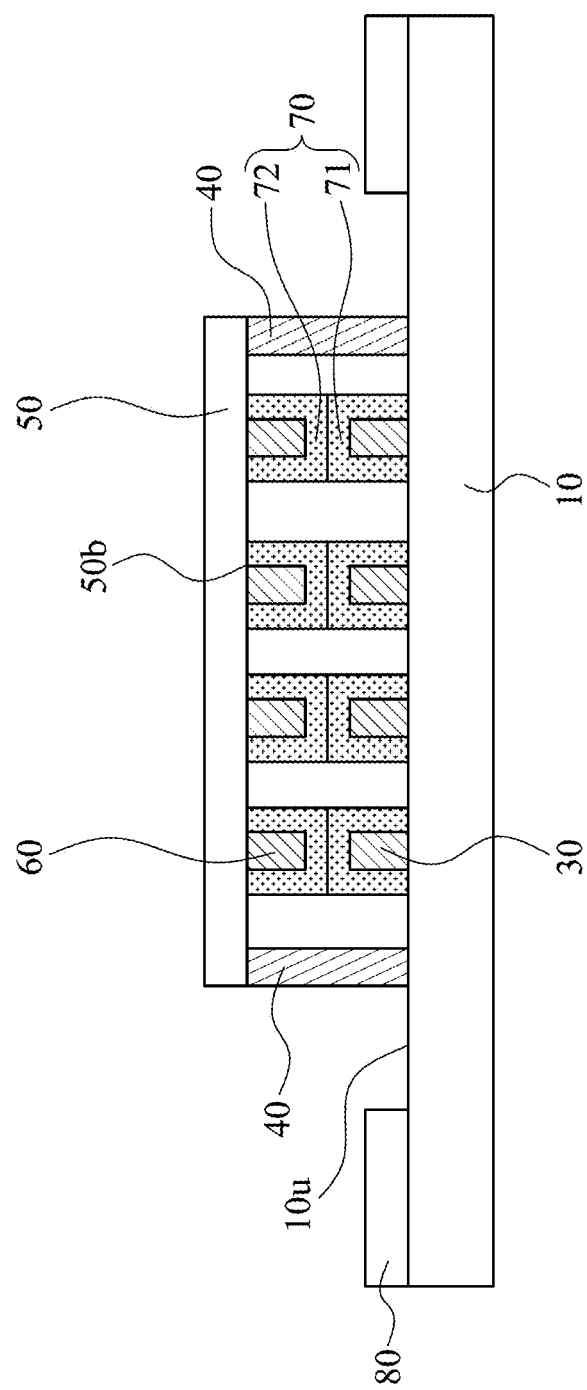
FIG. 1B is a cross-sectional view along the line B-B' of the semiconductor package of FIG. 1A.

FIG. 1A is a top view of a semiconductor package 1 in accordance with some embodiments of the present disclosure. FIG. 1B is a cross-sectional view along the line B-B' of the semiconductor package 1 of FIG. 1A.

Referring to FIG. 1B, the semiconductor package 1 may include a substrate 10, a substrate 50, a plurality of bonding elements 30, a plurality of bonding elements 60, a plurality of supporting structures 40, and a plurality of conductive structures 70. The bonding elements 30 are disposed on an upper surface 10u of the substrate 10. The bonding elements 60 are disposed on a lower surface 50b of the substrate 50. The substrate 50 is disposed over the substrate 10 and the lower surface 50b of the substrate 50 faces the upper surface 10u of the substrate 10. Each of the bonding elements 60 may correspond to or be aligned with a respective one of the bonding elements 30.

The substrate 10 or 50 may be or include, for example, a semiconductor substrate, a ceramic substrate, a plastic substrate or other suitable substrates. The semiconductor substrate may include, for example but is not limited to, silicon (Si) or other suitable semi-conductive materials. The substrate 10 or 50 may be or include a wafer or die, such as silicon wafer or die. The substrate 10 or 50 may be or include a redistribution layer. The redistribution layer may be composed of multiple dielectric layers and metal layers and vias. The substrate 10 is electrically connected to the bonding elements 30 and may include one or more pad(s) and/or trace(s) on the upper surface 10u. The substrate 50 is electrically connected to the bonding elements 60 and may include pad(s) and/or trace(s) on the lower surface 50b.

In the embodiments as illustrated in FIG. 1A and FIG. 1B, the substrate 10 is a wafer and the substrate 50 is a die. The substrate 10 may include pads 80 disposed on the upper surface 10u. In some embodiments, the pads 80 may be monitor pads which are configured to test whether the electroplating layers joint the bonding elements 30 of the substrate 10 and the bonding elements 60 of the substrate 50. In some other embodiments, the substrate 10 is a die and the substrate 50 is a die.

The supporting structures 40 may be disposed between the substrate 10 and the substrate 50. The supporting structures 40 may be disposed on corners of the substrate 10 or 50 (see FIG. 1A). A height (or thickness) of the supporting structure 40 can be determined such that the bonding elements 60 do not directly contact the bonding elements 30. In some embodiments, the supporting structures 40 may be formed of a solder paste (e.g., SnAg). In some embodiments, the supporting structures 40 may be spacers.

In some embodiments, the bonding elements 30 or 60 are disposed in a bonding region 30r (see FIG. 1A). The bonding elements 30 or 60 may include, for example, conductive materials, such as copper (Cu), aluminum (Al), iron (Fe), zinc (Zn), nickel (Ni), tin (Sn), lead (Pb), silver (Ag), mercury (Hg), gold (Au) or a combination thereof.

The conductive structure 70 may include a conductive layer 71 and a conductive layer 72. The conductive layers 71 may be formed on the bonding elements 30 and the conductive layers 72 may be formed on the bonding elements 60 during the plating process (e.g., electroless plating). An upper surface of the conductive layer 71 directly contacts a lower surface of the conductive layer 72. Therefore a bonding element 30 can be bonded to a respective bonding element 60 via the conductive structure 70. In some embodiments, there may be a boundary between the conductive layer 71 and the conductive layer 72. In some embodiments, there is no obvious boundary between the conductive layer 71 and the conductive layer 72. In some embodiments, the conductive layer 71 and the conductive layer 72 are plating layers. In some embodiments, the conductive layer 71 and the conductive layer 72 are electroless plating layers.

Figure 1C:
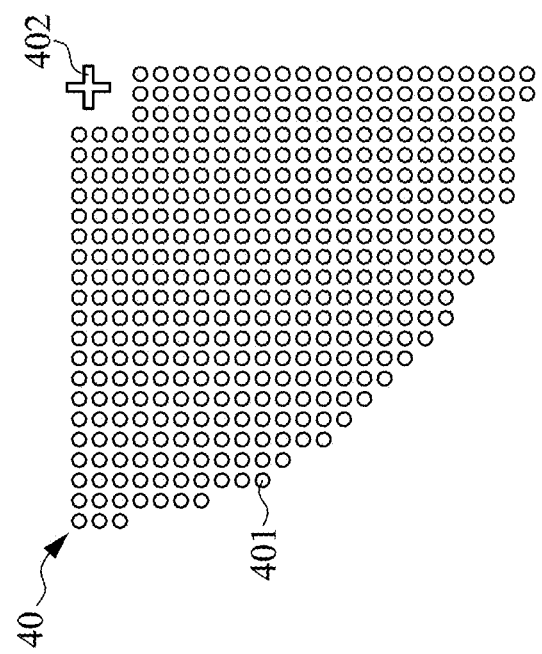
FIG. 1C is an enlarged view of a support structure in accordance with some embodiments of the present disclosure.

FIG. 1C is a top view of the supporting structure 40 in accordance with some embodiments of the present disclosure. In some embodiments, the supporting structures 40 may include a plurality of supporting elements 401 separated from each other. The supporting structures 40 may include an alignment mark 402. The supporting elements 401 may be made of metal, alloy or polymer. In some embodiments, the supporting elements 401 may be pillars surrounded by benzocyclobutene (BCB), polyamide, polyimide, UV resin, etc.

FIG. 2A, FIG. 2B, FIG. 2C, FIG. 2D, FIG. 5A, FIG. 6 and FIG. 7 illustrate various semiconductor packages in accordance with some embodiments of the present disclosure. The configuration of the supporting structures and the bonding elements may vary. To readily understand the configuration of the supporting structures and the bonding elements, some components (such as the substrate 50, the bonding elements 60 and the conductive structure 70) are omitted in these drawings.

Figure 2A:
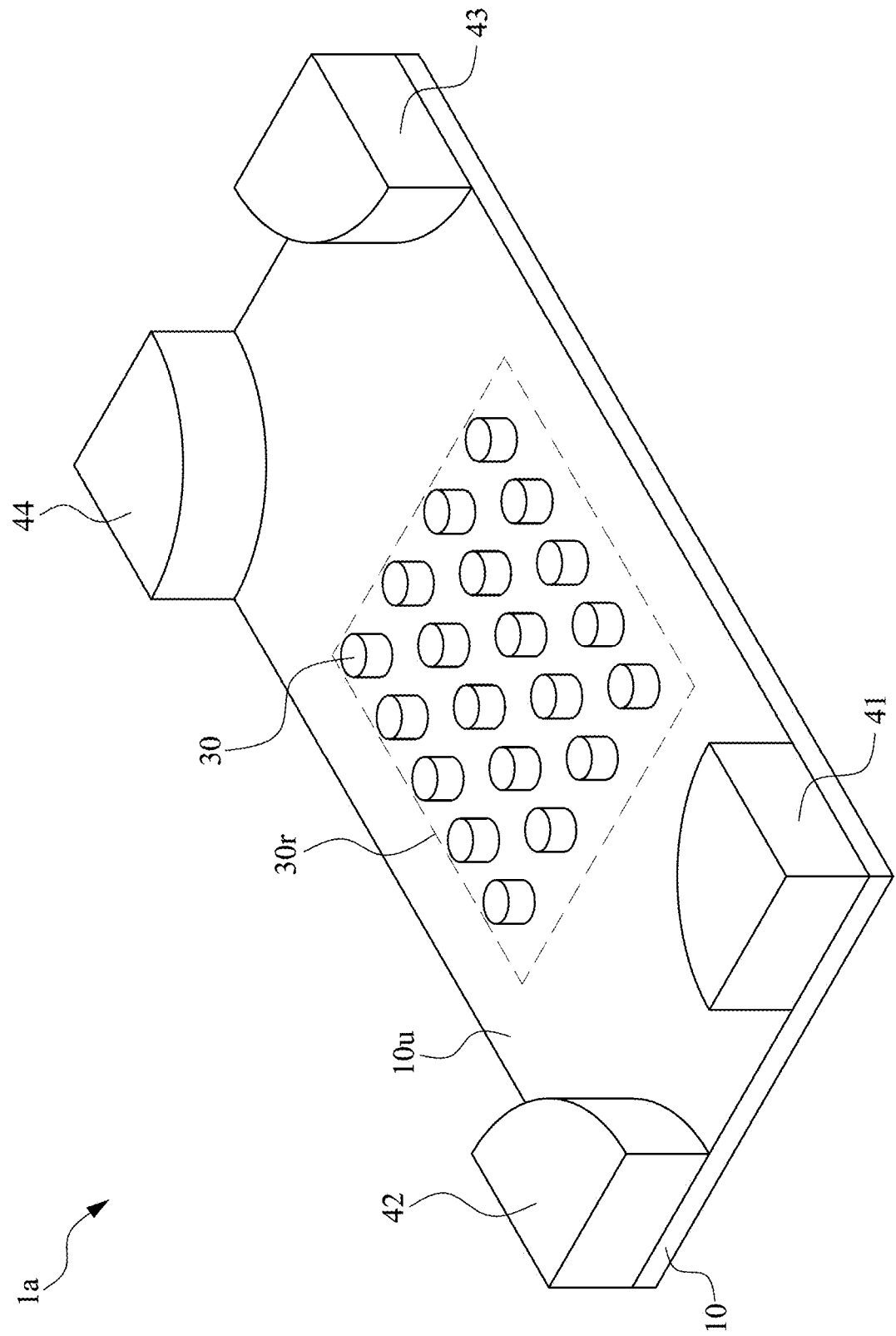
FIG. 2A is a top perspective view of a semiconductor package in accordance with some embodiments of the present disclosure.

FIG. 2A is a top perspective view of a semiconductor package 1a in accordance with some embodiments of the present disclosure. For example, the semiconductor package 1a may include a substrate 10, a plurality of bonding elements 30 and a plurality of supporting structures 41, 42, 43 and 44 (corresponding to supporting structures 40 in FIG. 1A and FIG. 1B).

The bonding elements 30 may be disposed on the upper surface 10u of the substrate 10. The bonding region 30r may be an imaginary region for disposing the bonding elements 30 on the substrate 10. The bonding region 30r may have a square-shaped profile, a rectangle-shaped profile, a trapezoid-shaped profile, a circle-shaped profile, an oval-shaped profile or other profiles.

The supporting structures 41, 42, 43 and 44 may be disposed on the upper surface 10u of the substrate 10. In some embodiments, the supporting structures 41, 42, 43 and 44 may be disposed on corners, for example, four corners, of the upper surface 10u of the substrate 10. The supporting structures 41, 42, 43 and 44 may be separated from each other. The supporting structures 41, 42, 43 and 44 may be configured to define flow channels, which determine the flow field of a fluid (e.g., a plating solution). The supporting structures 41, 42, 43 and 44 may be island structures which are separated from each other. For example, the supporting structures 41, 42, 43 and 44 may independently have a quarter round profile or other profiles. In some embodiments, the supporting structures 41, 42, 43 and 44 may have the same profile. In some embodiments, the supporting structures 41, 42, 43 and 44 may have different profiles, which will be described later.

Figure 2B:
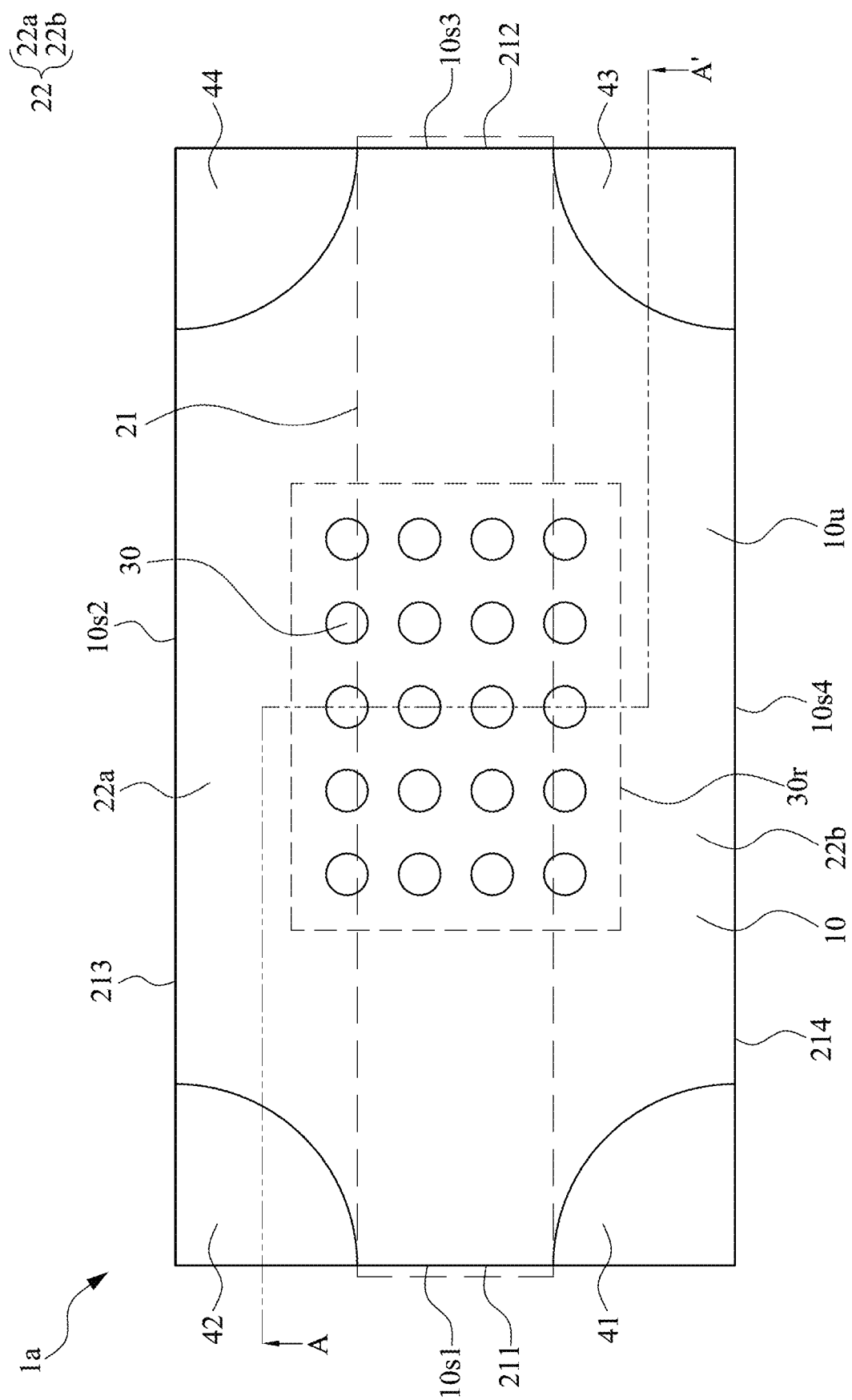
FIG. 2B is a top view of a semiconductor package in accordance with some embodiments of the present disclosure.

FIG. 2B is a top view of a semiconductor package 1a in accordance with some embodiments of the present disclosure.

As shown in FIG. 2B, the substrate 10 may have sides 10s1, 10s2, 10s3 and 10s4. The side 10s1 is opposite to the side 10s3; the side 10s2 is opposite to the side 10s4 and adjacent to the side 10s1 and the side 10s3. The supporting structure 41 may be disposed on a corner constituted by the side 10s1 and the side 10s4. The supporting structure 42 may be disposed on a corner constituted by the side 10s1 and the side 10s2. The supporting structure 43 may be disposed on a corner constituted by the side 10s3 and the side 10s4. The supporting structure 44 may be disposed on a corner constituted by the side 10s2 and the side 10s3.

In some embodiments, the supporting structures 41, 42, 43 and 44 may define an opening 211, an opening 212, an opening 213 and an opening 214 on the upper surface 10u of the substrate 10. The openings 211, 212, 213, 214 may be an inlet or an outlet for a fluid (e.g., a plating solution) to enter or leave the upper surface 10u of the substrate 10. The opening 211 may be defined by the supporting structure 41 and the supporting structure 42, and located at the side 10s1. The opening 212 may be defined by the supporting structure 43 and the supporting structure 44, and located at the side 10s3. The opening 213 may be defined by the supporting structure 42 and the supporting structure 44, and located at the side 10s2. The opening 214 may be defined by the supporting structure 41 and the supporting structure 43, and located at the side 10s4.

In some embodiments, the supporting structures 41, 42, 43 and 44 may define a flow channel 21 and a flow channel 22 on the upper surface 10u of the substrate 10. In some embodiments, the flow channel 21 is the main flow channel. The flow channel 21 may extend from the opening 211 to the opening 212. In some embodiments, the flow channel 21 may include an inlet and an outlet. In some embodiments, one of the openings, 211 and 212, is an inlet, and the other one is an outlet. For example, the opening 211 may be an inlet of the flow channel 21, and the opening 212 may be an outlet of the flow channel 21, which means that fluid may enter the upper surface 10u of the substrate 10 from the opening 211 and leave the upper surface 10u of the substrate 10 from the opening 212.

The flow channel 22 may be in fluid communication with the flow channel 21. The flow channel 22 may be spaced apart from the opening 211 and the opening 212 of the flow channel 21. That is, the flow channel 22 may be spaced apart from the inlet and the outlet of the flow channel 21. The flow channel 22 may include a channel portion 22a and a channel portion 22b separated from the channel portion 22a. The flow channel 22 may have a portion overlapping with a portion of the flow channel 21 (referred to as "overlapping portion"). The channel portion 22a and the channel portion 22b may be located at opposite sides of the flow channel 22 and connect to each other through the overlapping portion.

In some embodiments, the flow channel 22 may include an inlet and an outlet. For example, the opening 213 may be an inlet of the flow channel 22, and the opening 214 may be an outlet of the flow channel 22; in such embodiments, fluid may enter the upper surface 10u of the substrate 10 from the opening 213, pass through the overlapping portion and leave the upper surface 10u of the substrate 10 from the opening 214 or other openings. In some embodiments, the opening 213 and the opening 214 may be outlets; for example, fluid may be enter the upper surface 10u of the substrate 10 from the opening 211 and leave the upper surface 10u of the substrate 10 from the opening 212, opening 213 and opening 214.

The flow channel 21 and the flow channel 22 constitute a bonding region 30r. The bonding elements 30 are located in the bonding region 30r. In some embodiments, the bonding region 30r may include a first portion located in the flow channel 21 and a second portion located outside the flow channel 21. The second portion may be located in the flow channel 22. In some embodiments, the bonding region (e.g. 30r) includes a portion located in the overlapping region.

Figure 2C:
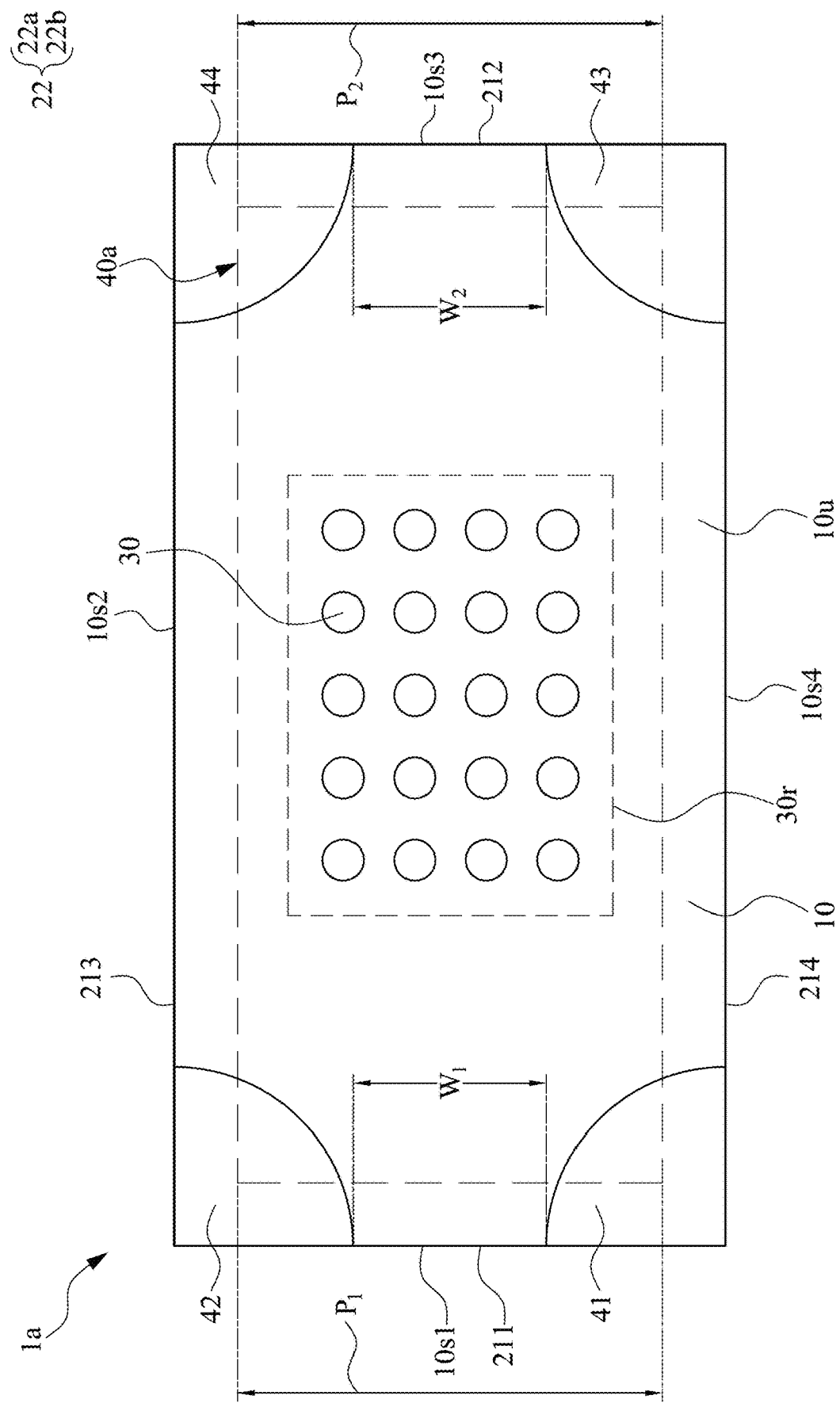
FIG. 2C is a top view of a semiconductor package in accordance with some embodiments of the present disclosure.

FIG. 2C is a top view of a semiconductor package 1a in accordance with some embodiments of the present disclosure. In some embodiments, the cross-sectional area of the supporting structure 41 may be the same as that of the supporting structure 42, 43 and 44 from a top view.

As shown in FIG. 2C, the opening 211 may have a width $W_1$, and the opening 212 may have a width $W_2$. In some embodiments, the width $W_1$ may be substantially equal to the width $W_2$. The supporting structure 41 and the supporting structure 42 may define a pitch $P_1$ at the side 10s1, The supporting structure 43 and the supporting structure 44 may define a pitch $P_2$ at the side 10s3. The pitch may be defined as a length between geometry centers, for example, centers of gravity, of two adjacent supporting structures. In some embodiments, the pitch $P_1$ may be equal to the pitch $P_2$. In some embodiments, the size of the opening 211 may be substantially identical to the size of the openings 212, 213 and 214.

The geometric centers of the supporting structures 41, 42, 43 and 44 may define an imaginary area 40a. The imaginary area 40a may be defined by lines connecting the geometric centers of two adjacent supporting structures among the supporting structures 41, 42, 43 and 44. In some embodiments, the imaginary area 40a may enclose the bonding region 30r. In some embodiments, the imaginary area 40a may enclose the bonding elements 30. In some embodiments, the imaginary area 40a may enclose a portion of the bonding elements 30.

Figure 2D:
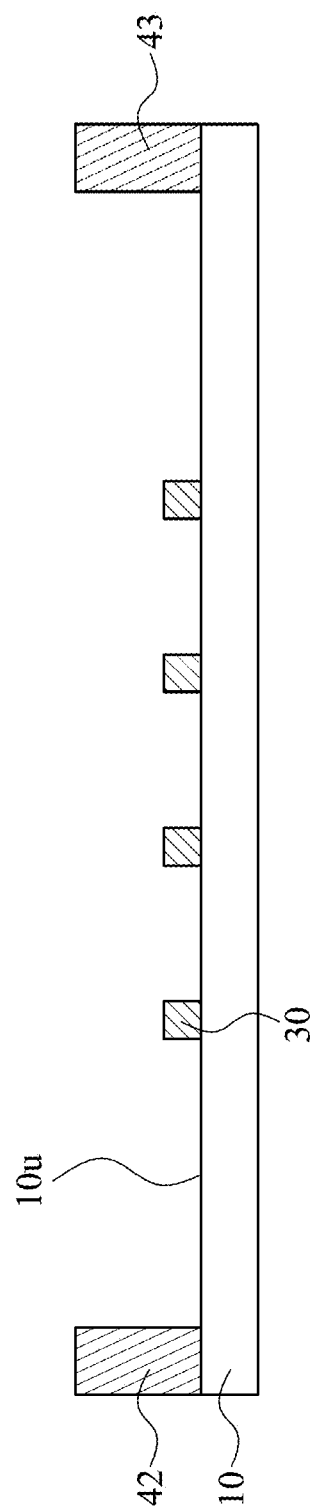
FIG. 2D is a cross-sectional view along the line A-A' of the semiconductor package of FIG. 2B.

FIG. 2D is a cross-sectional view along the line A-A' of the semiconductor package 1a of FIG. 2B. As shown in FIG. 2D, the thickness of the supporting structures (e.g., 42 and 43) may be greater than the thickness of the bonding elements 30.

Figure 3:
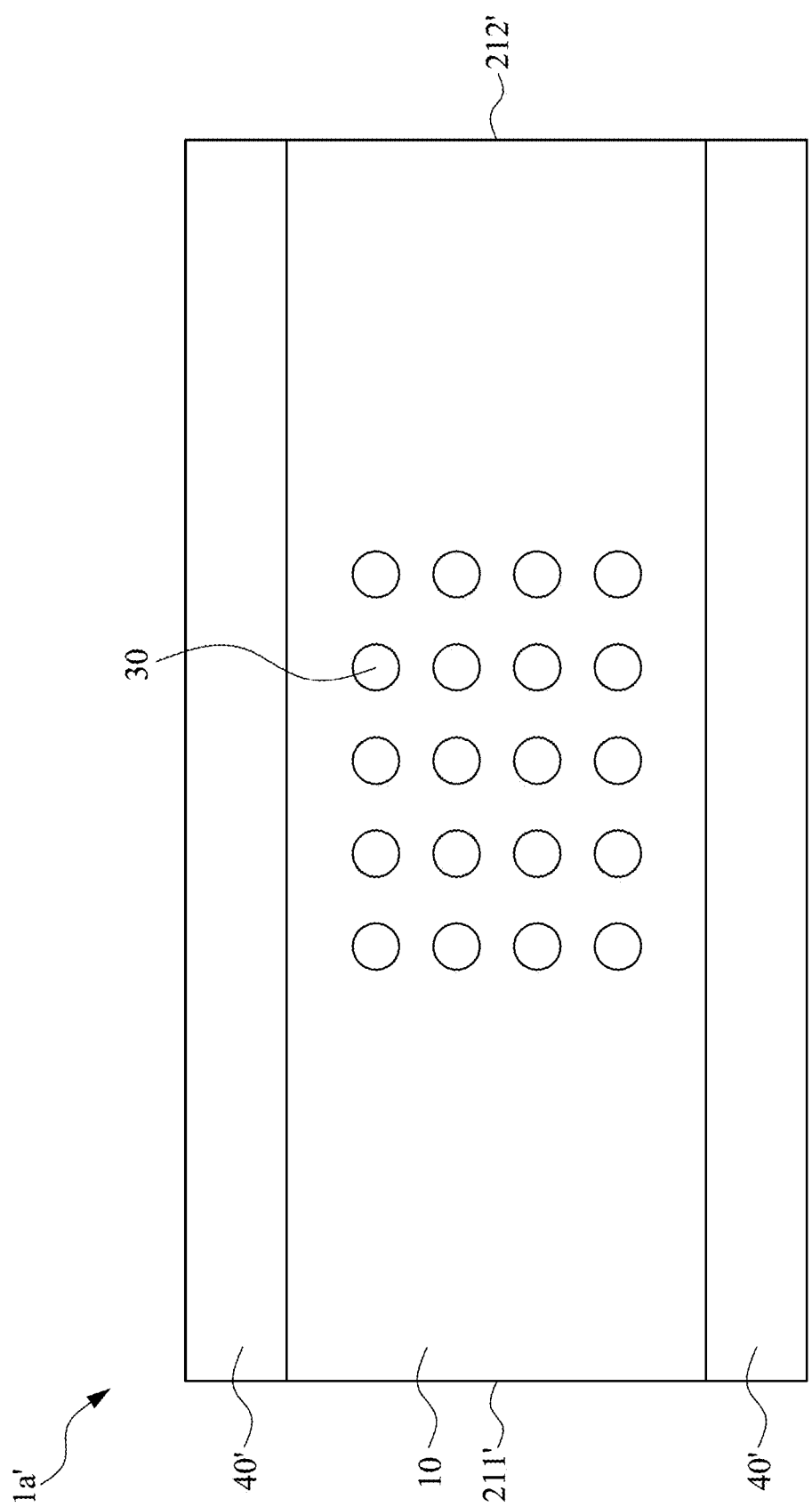
FIG. 3 is a top perspective view of a comparative example of a semiconductor package in accordance with some embodiments of the present disclosure.

FIG. 3 is a top view of a comparative example of a semiconductor package 1a'. As shown in FIG. 3, the semiconductor package 1a' may have a structure similar to the semiconductor package 1a, except that the semiconductor package 1a' includes two supporting structures 40' replacing the supporting structures 41, 42, 43 and 44.

The supporting structures 40' are located at two opposite sides of the substrate 10, and define openings 211' and 212' at the other two opposite sides of the substrate 10, respectively. The supporting structures 40' may have a bar-shaped profile or a strip-shaped profile. The supporting structures 40' define a straight flow channel having an inlet and an outlet corresponding to the openings 211' and 212', respectively.

Figure 4A:
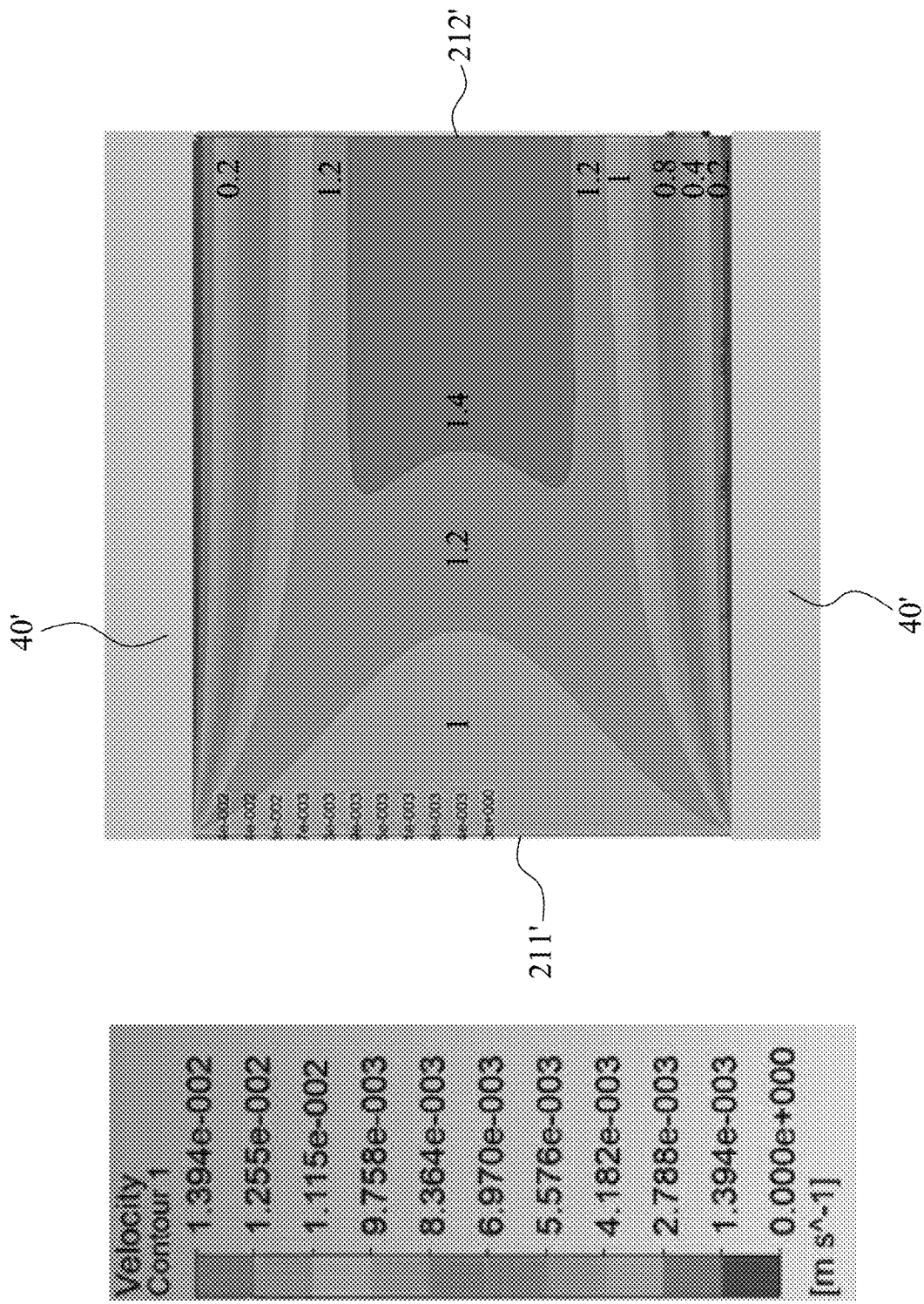
FIG. 4A is the simulation result of the flow field in the flow channel of a semiconductor package in accordance with a comparative example.
Figure 4B:
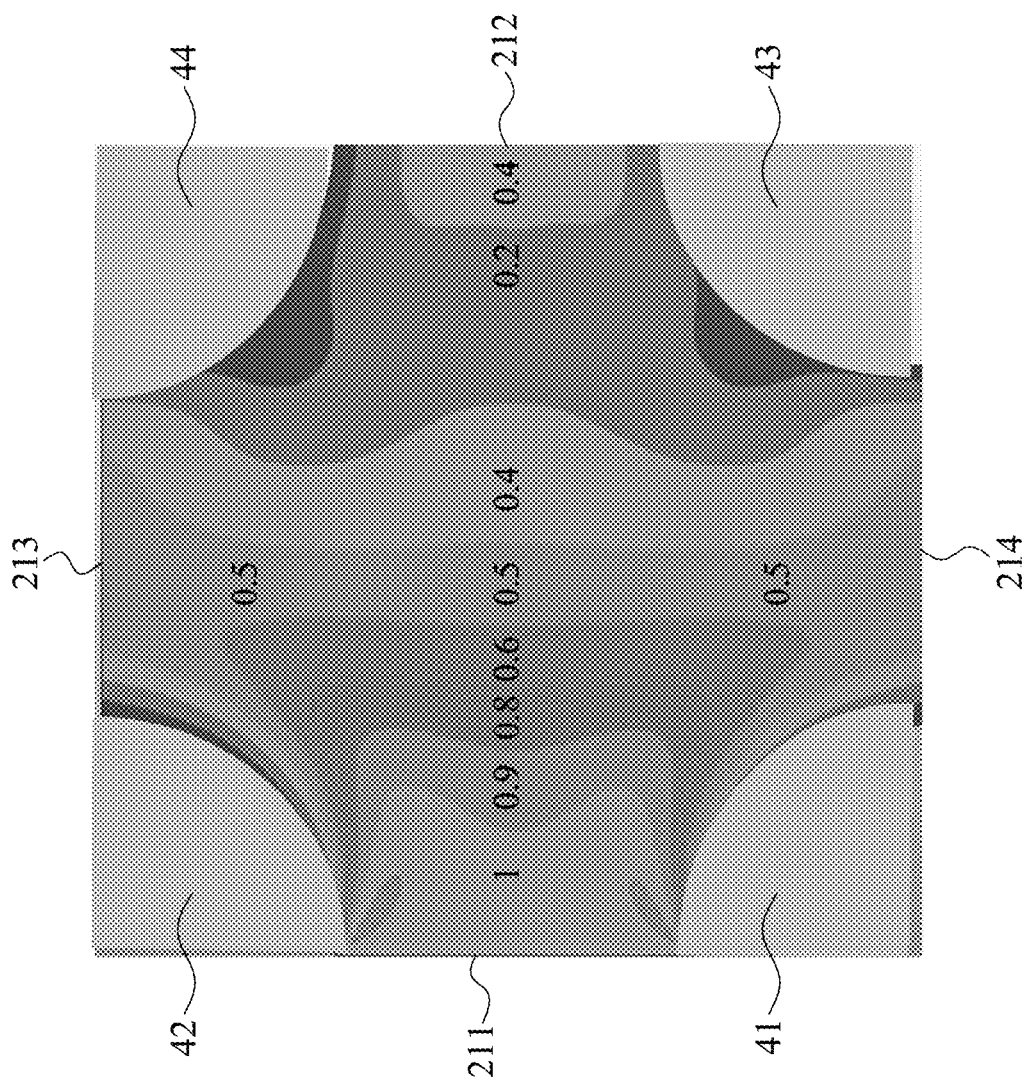
FIG. 4B is the simulation result of the flow field in the flow channels of the semiconductor package in accordance with some embodiments of the present disclosure.
Figure 4B:
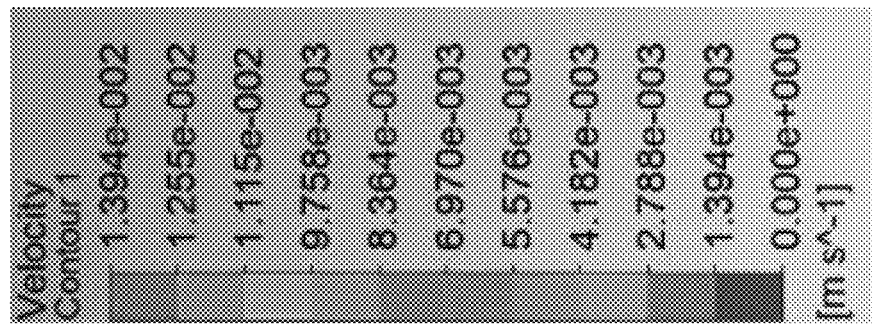

FIG. 4A is the simulation result of the flow field developed in the flow channel of the semiconductor package 1a' of FIG. 3 in the absence of bonding elements. FIG. 4B is the simulation result of the flow field developed in the flow channels of the semiconductor package 1a of FIG. 2B in the absence of bonding elements. In FIG. 4A, the opening 211' is an inlet and the opening 212' is an outlet. In FIG. 4B, the opening 211 is an inlet and the openings 212, 213 and 214 are outlets. The fluid is introduced at a flow rate of 0.01 m/s, the size of the substrate 10 is 8×8 mm$^2$, and the total cross-sectional surface area of the supporting structures 40' of the semiconductor package 1a' is the same as that of the supporting structures 41, 42, 43 and 44 of the semiconductor package 1a. The velocity of the fluid at different positions is marked in the drawings with a unit of "$10^{-2}$ m/s."

As shown in FIG. 4A, in a comparative example, fluid may have a lower flow velocity at a position close to the two supporting structures and a greater flow velocity at a position far from the two supporting structures (i.e., having a behavior similar to a laminar flow). Concentration gradient is thus-formed, i.e., the fluid may have a lower concentration of reactive species at a position close to the two supporting structures and a higher concentration of reactive species at a position far from the two supporting structures. Therefore, the electroless plating layers formed at a position close to the two supporting structures are thinner than those formed at a position far from the two supporting structures. On the other hand, despite the positions close to the two supporting structures, the flow velocity at the outlet is greater than the flow velocity at the inlet. In addition, the concentration of reactive species decrease from the inlet to the outlet since they are consumed due to being plated on the bonding elements. It is found that the electroless plating layers close to the outlet are thinner than those close to the inlet. Without being bound by theory, the faster velocity at a position close to the outlet may result in an insufficient time for the reactive species to being plated on the bonding elements. Further, FIG. 4A shows a great flow velocity difference from a position close to the supporting structure to a position far from the supporting structure, the flow velocity difference becomes more and more apparent after the fluid enters the flow channel from the opening 211' (inlet) and flows towards the opening 212' (outlet), and the overall flow field developed in the flow channel as shown in FIG. 4A is relatively non-uniform as compared to that shown in FIG. 4B. Such a nonuniform distribution of flow field cause a greater deviation of the thickness of the electroless plating layers at different positions and affect the bonding strength between the electroless plating layers which are bonded together during the electroless plating process. For example, the bonding strength between the bonded electroless plating layers at a position close to the supporting structure or close to the outlet may be relatively weak, while the bonding strength between the bonded electroless plating layers at a position far from the supporting structure or close to the inlet may be relatively strong. As a result, the electroless plating layers close to the supporting structures or the outlet may be prone to break.

As shown in FIG. 4B, the fluid enters the flow channels from the opening 211 (inlet) and flows towards the openings 212, 213 and 214 (outlets). There is relative small flow velocity difference developed along a direction orthogonal to a flow direction from the inlet 211 to the out 212 (i.e., the flow direction in the flow channel 21 of FIG. 2B). FIG. 4B reveals that the flow field developed according to the present disclosure is relatively uniform as compared to that developed according to the comparative example as shown in FIG. 4A, even when the region close to the outlets 212, 213 and 214 or close to the supporting structures 41, 42, 43 and 44 is taken into consideration. The concentration difference can be further reduced as compared to the comparative example of FIG. 4A. Further, the flow velocity at the outlets 212, 213 and 214 is slower than the flow velocity at the inlet 211. Without being bound by theory, the slower velocity at a position close to the outlets may provide more sufficient time for the reactive species to being plated on the bonding elements. When there is enough time for forming the electroless plating layers, the electroless plating layers close to the supporting structure or close to the outlet may have enough thickness, which may enhance the bonding strength between them. Therefore, the deviation of the thickness of the electroless plating layers at different positions can be reduced (i.e., the thickness of the electroless plating layers formed at different sites of the substrate are relatively uniform) and the bonding structures of the semiconductor package become more robust.

As discussed above with reference to FIG. 4B, the semiconductor package 1a according to the present disclosure is applicable to a plating process (e.g., an electroless plating process). The supporting structures 41, 42, 43 and 44 define more than one flow channels (e.g., 21 and 22) and additional inlet(s)/outlet(s) (e.g., 213 and 214). Therefore, a relatively uniform flow field can be created and the thickness of the electroless plating layers formed at different sites of the substrate are relatively uniform as compared to the comparative examples. As a result, the overall strength of the bonding structures are enhanced which is helpful to prevent the electroless plating layers from breaking.

Figure 5A:
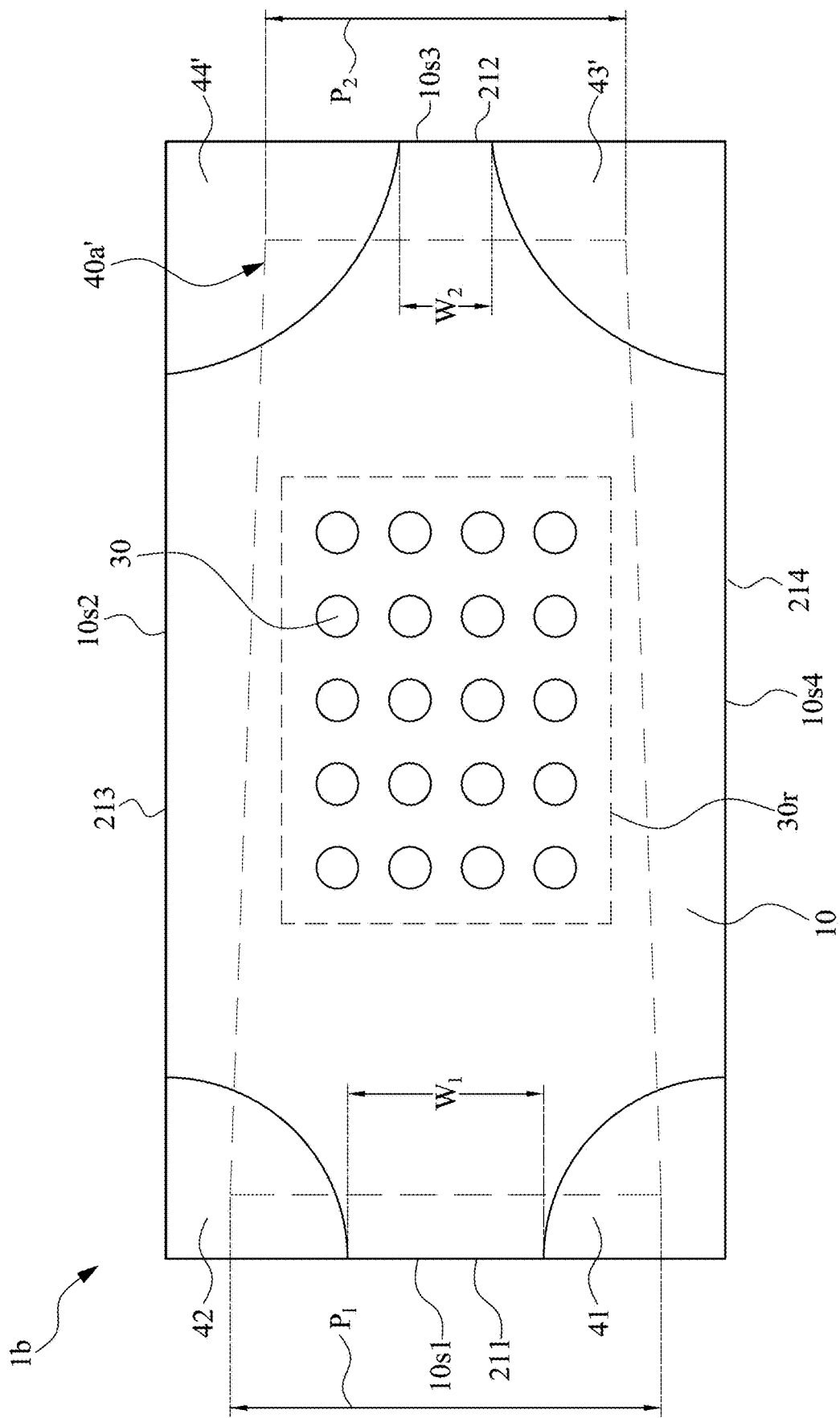
FIG. 5A is a top view of a semiconductor package in accordance with some embodiments of the present disclosure.

FIG. 5A is a top view of a semiconductor package 1b in accordance with some embodiments of the present disclosure. The semiconductor package 1b of FIG. 5A has a similar structure to that of the semiconductor package 1a of FIG. 2B, except that semiconductor package 1b includes a supporting structure 43' and a supporting structure 44'.

The supporting structure 43' and the supporting structure 44' may independently have a different profile from that of the supporting structure 41 or 42. For example, the size of the supporting structure 43' or supporting structure 44' may be different from that of the supporting structure 41 or 42. For example, the supporting structure 43' may have a size greater than that of the supporting structure 41; the supporting structure 44' may have a size greater than that of the supporting structure 42. That is, the cross-sectional area of the supporting structure 41 may be different from that of the supporting structure 43' from a top view. Thus, the pitch $P_1$ may be different from the pitch $P_2$. Further, the width $W_1$ of the opening 211 may be different from the width $W_2$ of the opening 212. In some embodiments, the pitch $P_1$ may be greater than the pitch $P_2$. In some embodiments, the width $W_1$ of the opening 211 may be greater than the width $W_2$ of the opening 212. In this embodiment, the imaginary area 40a' may have, for example, a trapezoid-shaped profile.

Figure 5B:
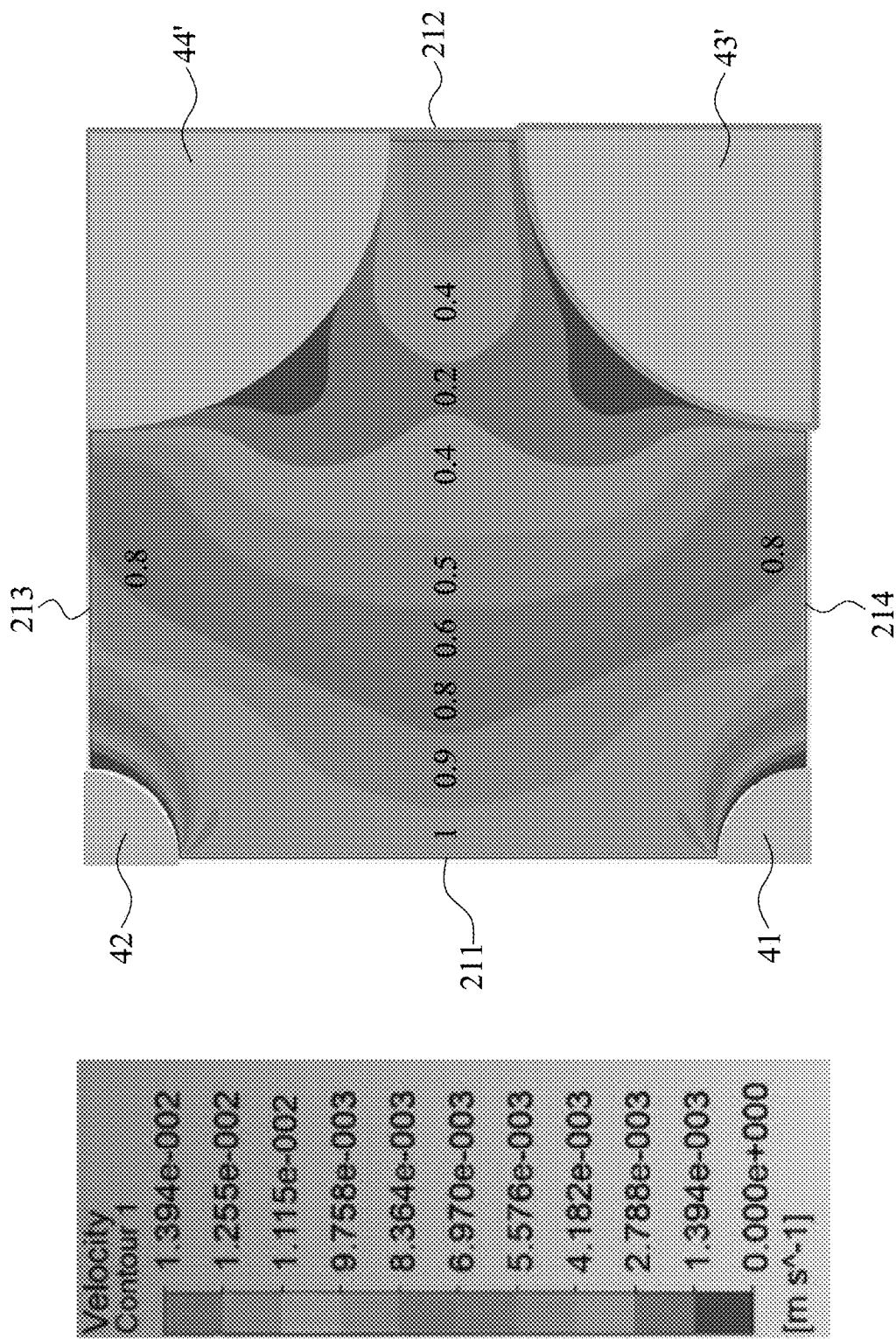
FIG. 5B is the simulation result of the flow field in the flow channels of the semiconductor package in accordance with some embodiments of the present disclosure.

FIG. 5B is the simulation result of the flow field developed in the flow channel of the semiconductor package 1b of FIG. 5A in the absence of bonding elements. Similar to the embodiments illustrated in FIG. 4B, the opening 211 is an inlet and the openings 212, 213 and 214 are outlets. The fluid is introduced at a flow rate of 0.01 m/s, the size of the substrate 10 is 8×8 mm², and the total cross-sectional surface area of the supporting structures 41, 42, 43' and 44' of the semiconductor package 1b is the same as that of the supporting structures 40' of the semiconductor package 1a'. The velocity of the fluid at different positions is marked in the drawings with a unit of "$10^{-2}$ m/s." As shown in FIG. 5B, the flow field developed in the flow channels of the semiconductor package 1b is relatively uniform as compared to that developed according to the comparative example as shown in FIG. 4A. The concentration difference can be further reduced as compared to the comparative example of FIG. 4A. Therefore, the deviation of the thickness of the electroless plating layers at different positions can be reduced (i.e., the thickness of the electroless plating layers formed at different sites of the substrate are relatively uniform) and the bonding structures of the semiconductor package become more robust.

Figure 6:
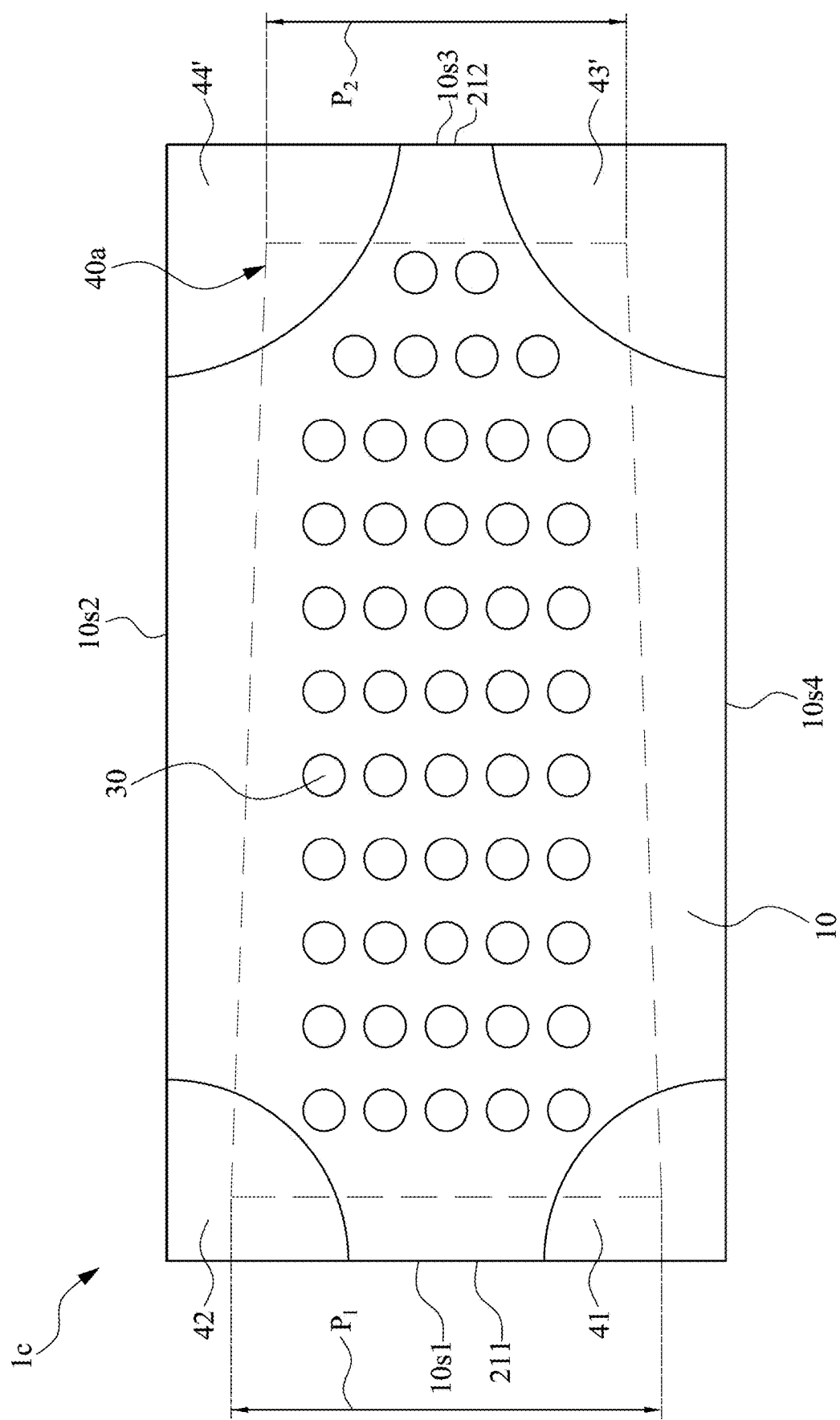
FIG. 6 is a top view of a semiconductor package in accordance with some embodiments of the present disclosure.

FIG. 6 is a top view of a semiconductor package 1c in accordance with some embodiments of the present disclosure. The semiconductor package 1c of FIG. 6 has a similar structure to that of the semiconductor package 1b of FIG. 5A, except that the distribution of the bonding elements 30 of the semiconductor package 1c is different from that of the semiconductor package 1b.

In some embodiments, the number of the bonding elements 30 between the supporting structure 41 and the supporting structure 42 may be different from the number of the bonding elements 30 between the supporting structure 43' and the supporting structure 44'. In some embodiments, the number of the bonding elements 30 between the supporting structure 41 and the supporting structure 42 may be greater than the number of the bonding elements 30 between the supporting structure 43' and the supporting structure 44'. That is, the number of the bonding elements 30 adjacent to the side 10s1 of the substrate 10 may be greater than the number of the bonding elements 30 adjacent to the side 10s3 of the substrate 10. The distribution of the bonding elements 30 may depend on the flow field. Therefore, the distribution of the bonding elements 30 may be modified according to a change of the supporting structures.

Figure 7:
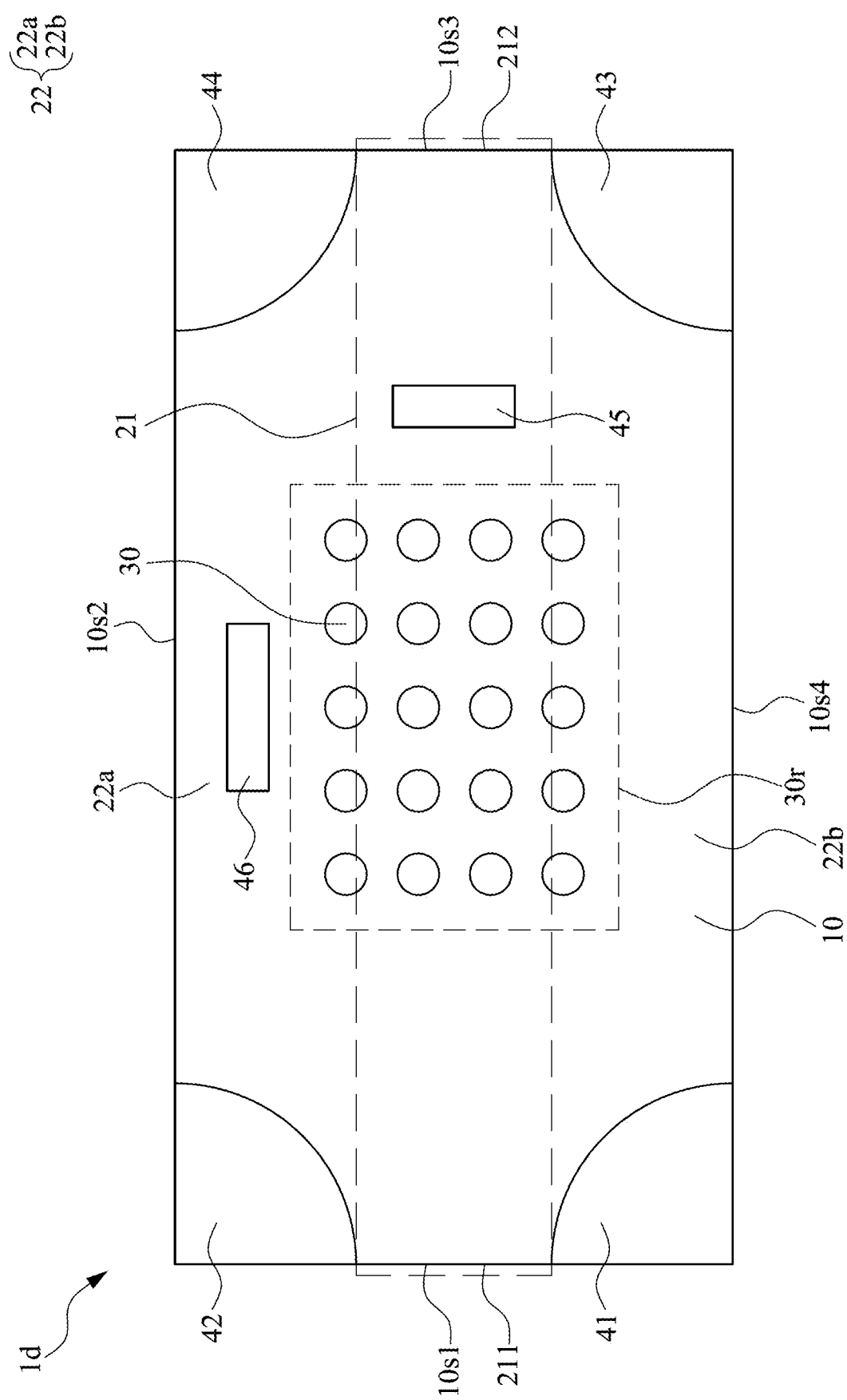
FIG. 7 is a top view of a semiconductor package in accordance with some embodiments of the present disclosure.

FIG. 7 is a top view of a semiconductor package 1d in accordance with some embodiments of the present disclosure. The semiconductor package 1d of FIG. 7 has a similar structure to that of the semiconductor package 1a of FIG. 2B, except that semiconductor package 1d may include a flow field controlling element 45 and a flow field controlling element 46.

The flow field controlling element 45 and the flow field controlling element 46 may be disposed on the substrate 10. The flow field controlling element 45 and the flow field controlling element 46 may be independently separated from the supporting structures 41, 42, 43 and 44. The flow field controlling element 45 and the flow field controlling element 46 may be configured to control or modify the fluid field. In some embodiments, the flow field controlling element 45 and the flow field controlling element 46 may be made of a material disclosed hereinbefore for the supporting structures 41, 42, 43 and 44. In some embodiments, the flow field controlling element 45 and the flow field controlling element 46 may overlap at least one of the flow channels 21 and 22, respectively. For example, the flow field controlling element 45 may be disposed within the flow channel 21, and the flow field controlling element 46 may be disposed within the flow channel 22. The flow field controlling element 45 and the flow field controlling element 46 may have a square-shaped profile, a rectangle-shaped profile, a trapezoid-shaped profile, a circle-shaped profile, an oval-shaped profile or other profiles. The size of the flow field controlling element 45 or the flow field controlling element 46 may be less than, equal to or greater than that of the supporting structure 41, 42, 43 or 44. In some embodiments, the location of the flow field controlling element 45 and the flow field controlling element 46 may be determined based on simulation data of the flow field. For example, the flow field controlling element 45 and the flow field controlling element 46 may be disposed in a region having a greater flow velocity, thereby slowing the flow velocity of fluid within the region. As a result, a relatively uniform flow field may be generated.

Figure 8:
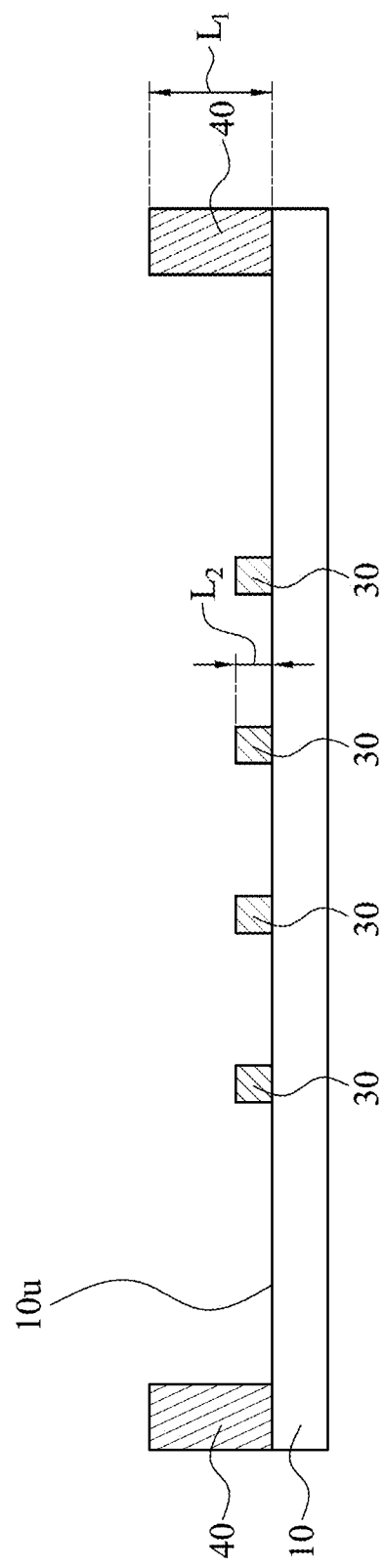
FIG. 8, FIG. 9 and FIG. 10 illustrate various stages of a method for manufacturing a semiconductor package in accordance with some embodiments of the present disclosure.
Figure 9:
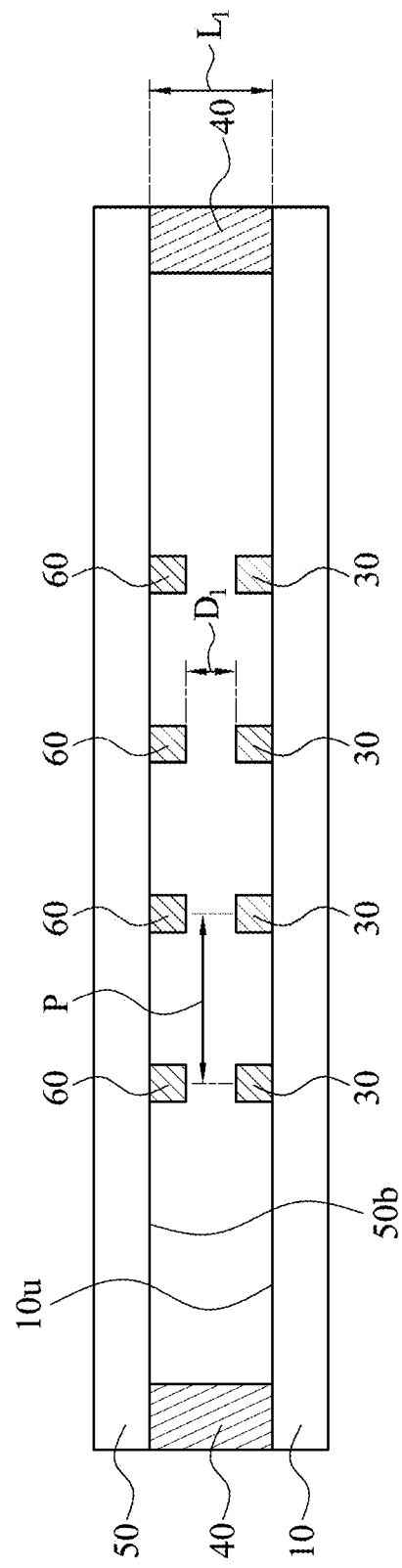
Figure 10:
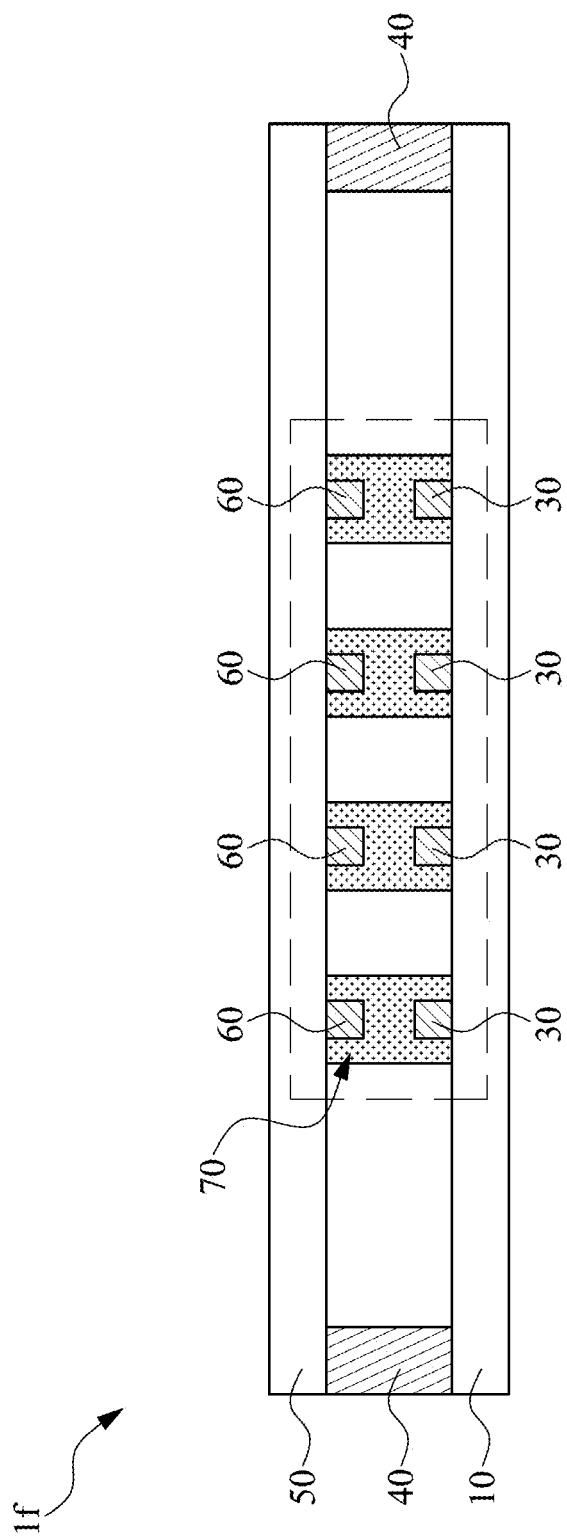

FIG. 8, FIG. 9 and FIG. 10 illustrate various stages of a method for manufacturing a semiconductor package in accordance with some embodiments of the present disclosure.

Referring to FIG. 8, a substrate 10 is provided. A plurality of bonding elements 30 are disposed on a surface 10u of the substrate 10. A plurality of supporting structures 40 are disposed on the surface 10u of the substrate 10. In some embodiments, the bonding elements 30 or the supporting structures 40 may be disposed on the pads (not shown) of the substrate 10. The thickness $L_1$ of the supporting structures 40 may be greater than the thickness $L_2$ of the bonding elements 30.

Referring to FIG. 9, a substrate 50 is provided. A plurality of bonding elements 60 are disposed on a lower surface 50b of the substrate 50. The substrate 50 may be attached to the substrate 10 through the supporting structures 40. One of the bonding elements 30 may correspond to one of the bonding elements 60. A distance $D_1$ between the bonding element 30 and the corresponding bonding element 60 is determined such that the electroless plating layer to be formed in a subsequent step well cover the top surface of the bonding element 30 and the bottom surface of the bonding element 60. A pitch P between two adjacent bonding elements 30 or two adjacent bonding elements 60 is determined to prevent the electroless plating layers formed on the two adjacent bonding elements from connecting to each other. In some embodiments, the thickness $L_1$ of the supporting structures 40 may be determined by the distance $D_1$.

Referring to FIG. 10, a conductive structure 70 may be formed, and a semiconductor package if may be produced. The conductive structure 70 may be an electroless plating layer. Fluid may enter from the inlet, and then the electroless plating layers may be formed on the bonding elements 30 and the bonding elements 60. Finally, the electroless plating layers formed on a bonding element 30 and on a corresponding bonding element 60 may meet together to form the conductive structure 70. The conductive structure 70 may connect one of the bonding elements 30 and one of the bonding elements 60.

Figure 11:
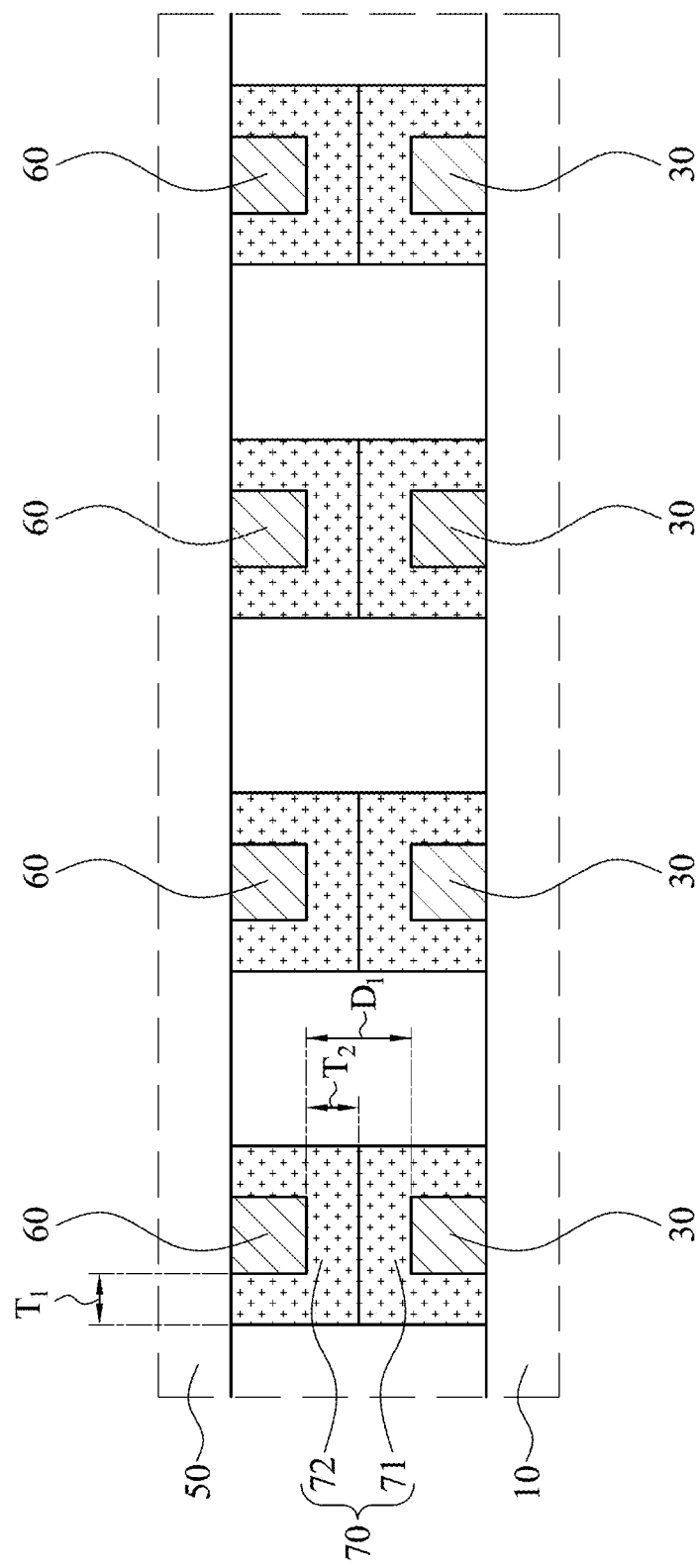
FIG. 11 is an enlarged view of a semiconductor package in accordance with some embodiments of the present disclosure.

FIG. 11 is a partially enlarged view of FIG. 10. In some embodiments, the conductive structure 70 may include a conductive layer 71 and a conductive layer 72. The conductive layer 71 may be formed on the bonding element 30. The conductive layer 72 may be formed on the bonding element 60. In some embodiments, there may be a boundary between the conductive layer 71 and the conductive layer 72. In some embodiments, there is no significant boundary between the conductive layer 71 and the conductive layer 72. The conductive layer 71 may cover the top surface and the lateral surface of the bonding elements 30. The conductive layer 72 may cover the top surface and the lateral surface of the bonding elements 60.

The conductive layer 71 or the conductive layer 72 may have a thickness $T_1$ in a lateral direction. The conductive layer 71 or the conductive layer 72 may have a thickness $T_2$ in a vertical direction. In some embodiments, the thickness $T_1$ may be different from the thickness $T_2$. In some embodiments, the thickness $T_1$ may be greater than the thickness $T_2$. In some embodiments, the ratio between the thickness $T_1$ and the thickness $T_2$ may be in a range from about 5:1 to about 1:1. In some embodiments, the ratio between the thickness $T_1$ and the thickness $T_2$ may be 5:1, 4.5:1, 3.5:1, 3:1, 2.5:1, 2:1; 1.5:1 or 1:1.

In this embodiment, the supporting structures 40 are configured to control the flow field, which may simplify the process for forming the semiconductor package. Further, the embodiments may be applied to a structure with a pitch of bonding elements less than or equal to 30 μm. Further, the bonding temperature may be reduced to be less than 80° C. during formation of the electroplating layers.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate having a first side and a second side adjacent to the first side;
   a plurality of bonding elements on the substrate; and
   a plurality of supporting structures disposed on the substrate and separated from each other, wherein the plurality of supporting structures define a first opening at the first side and a second opening at the second side,
   wherein the substrate comprises a third side opposite to the first side, the plurality of supporting structures define a first pitch at the first side and a second pitch at the third side, and the first pitch is different from the second pitch, and
   wherein a number of the bonding elements adjacent to the first side of the substrate is greater than a number of the bonding elements adjacent to the third side of the substrate.

2. The semiconductor package of claim 1, wherein the supporting structures are disposed on corners of the substrate.

3. The semiconductor package of claim 1, wherein the supporting structures comprise a first supporting structure and a second supporting structure, and a cross-sectional area of the first supporting structure is different from that of the second supporting structure, from a top view.

4. The semiconductor package of claim 1, wherein a height of the supporting structure is greater than a height of the bonding element.

* * * * *